United States Patent
Chang et al.

(10) Patent No.: US 6,535,146 B1
(45) Date of Patent: Mar. 18, 2003

(54) METHOD OF DETECTING SHORT-CIRCUITS OF KEYBOARD MATRIX

(75) Inventors: Yuchuan Chang, Taipei (TW); Kuang Shin Lin, Taipei (TW); Xue Ning Ren, Tien Chin (CN); Cheng Long Hu, Tien Chin (CN)

(73) Assignee: Inventec Corporation (TW)

( * ) Notice: Subject to any disclaimer, the term of this patent is extended or adjusted under 35 U.S.C. 154(b) by 408 days.

(21) Appl. No.: 09/594,336

(22) Filed: Jun. 15, 2000

(30) Foreign Application Priority Data

Jun. 15, 1999 (TW) ........................................ 88109956 A

(51) Int. Cl.$^7$ ............................................. H03M 11/00
(52) U.S. Cl. ......................... 341/26; 345/168; 361/680
(58) Field of Search ............................. 341/22, 26, 20, 341/175; 345/168; 361/680; 379/368

(56) References Cited

U.S. PATENT DOCUMENTS 5,623,261 A  *  4/1997  Rose ........................... 341/20
6,181,262 B1 *  1/2001  Bennett ....................... 341/175

* cited by examiner

*Primary Examiner*—Michael Horabik
*Assistant Examiner*—Hung Dang
(74) *Attorney, Agent, or Firm*—Peter F. Corless; Steven M. Jensen; Edwards & Angell, LLP

(57) ABSTRACT

A method of detecting short-circuits of a keyboard is provided. The method includes the steps of establishing a database of standard scanned codes and a keyboard matrix that corresponds to keys of a keyboard in the memory device of a computer mainframe and then predefining a set of 25 keys of the keyboard for detection purpose. When a tester presses one of the predefined keys, in the keyboard matrix a row of data line and a column of data line will connect with each other, allowing a keyboard controller to receive a signal variation responsive to the pressed key and then to produce a scanned code responding to the pressed key. After that, the scanned code is transmitted into the buffer of computer mainframe, triggering an interrupt IRQ1 in computer hardware. By executing a comparison program in the memory device of the computer mainframe, the computer mainframe compares the transmitted scanned code in the buffer with the data in the database stored in the memory device. As a result, whether the keys of the keyboard are short-circuited or not can be determined.

3 Claims, 5 Drawing Sheets

```
>Z,Q short
>ksin0,ksin1 short
>Z,X short
>ksout0,ksout1 short
```

METHOD OF DETECTING SHORT-CIRCUITS OF KEYBOARD MATRIX

BACKGROUND OF THE INVENTION

1. Field of the Invention

The present invention relates to methods of detecting computer keyboard and, more particularly, to a method of detecting short-circuits of a keyboard device for a computer.

2. Background of the Invention

In today's information era, computer keyboards are important external data input devices for users to communicate with computers. The performance of keys of keyboards is critical to the messages sent into computers, since users use them to enter information, data, and programs into computers. The input messages are then stored in the memory devices of computers. Therefore, detecting the functionality of keys of keyboards is a necessary routine for computer users.

In general, a keyboard is arranged in a form of matrix that comprises columns and rows of data lines. Each of the keys of the keyboard matrix has its own key symbol correspondingly. The short-circuit resulted in the keyboard matrix could be attributed to the following causes: short-circuit between a column of data line and another column of data line; short-circuit between a row of data line and another row of data line; short-circuit between a column of data line and a row of data line. An automatically detecting procedure built in computer BIOS is conventionally used to detect the short-circuit occurred between a column of data line and a row of data line when a computer is powered on and starts booting. Therefore, users only need to do with the short-circuit occurred between a row of data line and another row of data line and that occurred between a column of data line and a column of data line.

Certain learning-technique-based detection methods applied to computers, such as the softwares of QAFact and Amidiag in which the detection of the keys of keyboard is carried out in the procedure of diagnosing computer hardware, intercept the scanned code of each key by using the interrupt procedures of DOS (Disk Operating System) and BIOS (Basic Input Output System). Testers must observe the display of terminal screen directly when using diagnosing software for computer hardware, such as Qafactry 6.7, 7.0, AMI Diag and Compaq Diag, to detect short-circuits of computer keyboard matrix. They have to carefully look into the displayed diagram for the keyboard matrix on terminal screen when a key is pressed. Testers have to observe not only whether or not the site in the diagram corresponding to the pressed key shows appropriate reaction but also whether there are other cites indicating false signals responsive to keys which are pressed. To use the detecting method mentioned in the above, a tester has to press keys 102 times if the computer keyboard to be tested has 102 keys, and he or she has to carefully observe the flashing status of keyboard diagram on terminal screen each time a key is pressed. No message of text on terminal screen can inform a user of the short-circuit status of a keyboard matrix during a detection of keyboard when the learning techniques as mentioned in the above are used. Therefore, to examine the condition of a keyboard, a tester has to keep on observing terminal screen carefully until all keys have been pressed for a complete test, making the testing process time-consuming and laborious. In addition, the user can not get the result of detection of short-circuit only by testing a part of the keys.

SUMMARY OF THE INVENTION

The primary object of present invention is to provide a method of detecting short-circuits of a keyboard, which can be built into a computer system installed with a keyboard, allowing a tester to detect and determine short-circuit of the keyboard faster than the prior art.

Another object of the present invention is to provide a method of detecting short-circuits of a keyboard, which can be built into a computer system installed with a keyboard, allowing the scanned codes produced by a keyboard controller to be stored in a computer device's buffer so that the mainframe of the computer system can directly handle the scanned codes instead of ASCII codes.

A further object of the present invention is to provide a method of detecting short-circuits of a keyboard, which can be built into a computer system installed with a keyboard, allowing the keyboard controller of the keyboard to receive a signal and then produce a corresponding scanned code responsive to a key which is pressed to thereby trigger a hardware interrupt of IRQ1.

According to the above and other objects, the present invention provides a novel method of detecting short-circuits of a keyboard, which can be applied to a computer system consisting of a keyboard, a keyboard controller, a computer mainframe installed with a buffer, device of central processor, memory device, and a display unit.

To begin with the method of the present invention, a keyboard matrix, which corresponds to the keys of a keyboard is established. The keyboard matrix consists of columns of data lines and rows of data lines in the matrix form. Then, a database for storing scanned codes of the keyboard corresponding to the addresses of keyboard matrix is established in the memory device of the mainframe of a computer. When a tester presses a key, a column of data line and a row of data line connect with each other. A keyboard controller then receives a signal variation resulted from the key pressing and produces a scanned code responsive to the key which is pressed. The scanned code is thereafter sent into the computer mainframe and an interrupt IRQ1 of computer hardware is accordingly triggered. Subsequently, a pre-defined interrupt service procedure for replacing the traditional interrupt procedure of INT9H, transmits the scanned code into computer buffer directly.

By executing a comparison program in the memory device of the computer mainframe, the computer mainframe will compare the scanned code transmitted into the buffer with the codes in the database pre stored in the memory device. According to the result of the comparison, the address of keyboard matrix corresponding to the scanned code can be located. As a result, the key which is pressed can be determined among the keys of keyboard. Twenty-five keys which are predefined are provided for a tester to press one after one following an instruction given in the method of detecting short-circuits of a keyboard. When the key which is pressed is short-circuited, a message appeared on the display screen would indicate the short-circuited key by showing the row number of short-circuited data line or the column number of short-circuited data line. As only 25 keys, instead of all the keys of the keyboard, are required to determine short-circuited keys of the keyboard, the method of the invention can be conducted in a speed faster than the prior art.

BRIEF DESCRIPTION OF THE DRAWINGS

The above and other objects, features, and advantages of the present invention will become apparent from the following description when taken in conjunction with the accompanying drawings which illustrate preferred embodiments of the present invention by way of examples. The contents of accompanying drawings are described as following:

FIG. 3 is a schematic diagram of a keyboard and its corresponding keyboard matrix for illustrating the scanned code obtained from a key of the keyboard which is pressed;

FIG. 5 is a schematic diagram showing the results appeared on the display screen to indicate the short-circuited keys identified by the method of the present invention.

DETAILED DESCRIPTION OF PREFERRED EMBODIMENTS

Figure 1:
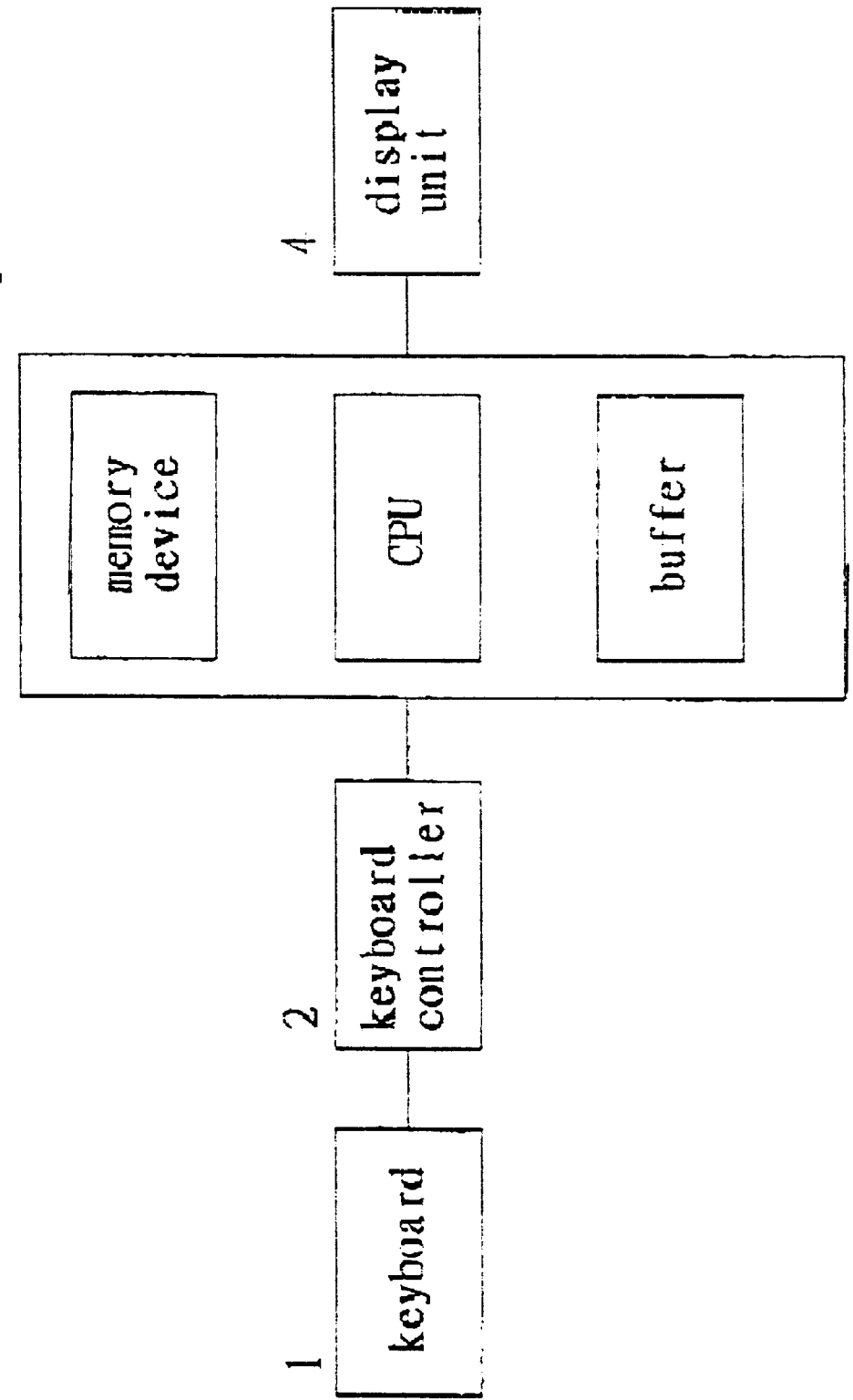
FIG. 1 is a system block diagram, showing the hardware architecture of a basic computer system for use in the method according to the present invention.

With reference to FIG. 1, the hardware architecture of a basic computer system applied to the method of detecting short-circuits of a keyboard according to the present invention is shown. As shown in FIG. 1, the computer system includes a keyboard 1, a keyboard controller 2, a computer mainframe 3, consisting of a buffer, a central processing unit and a memory device, and a display unit 4. The computer system could be any type of personal computer system, such as desktop, laptop, or palm-size computer system.

In the computer system, the keyboard 1 is connected with the keyboard controller 2, the keyboard controller 2 is connected with the computer mainframe 3, and the computer mainframe 3 is connected with the display unit 4.

First of all, a database of standard scanned codes and a keyboard matrix corresponding to the keyboard 1 are established in the memory device of the computer mainframe 3. When any one of the keys of the computer keyboard 1 is pressed to make a column data line contact with a row data line, the keyboard controller 2 will receive a signal variation from the keyboard 1 and thereby produce a scanned code responsive to the key which is pressed to then trigger a hardware interrupt IRQ1 installed in the computer mainframe 3. Then a predefined interrupt service procedure used to take over the traditional interrupt procedure of INT9H, transmits the scanned code into the buffer of the computer mainframe 3. By executing a comparison program in the memory device of the computer mainframe 3, the computer mainframe 3 compares the scanned code in the buffer with the codes in the database stored in the memory device. From the result of comparison, the computer mainframe can identify the corresponding address in the keyboard matrix for the scanned code. Therefore, the key which is pressed can be identified among the keys of the keyboard 1. 25 predefined keys are provided for a tester to press one by one following a certain instruction. If short-circuit occurs to one pressed key of the keyboard 1, messages displayed on the screen of display unit 4 will indicate the short-circuited key of the keyboard 1 and at the same time, the row index or the column index of a data line to which the key belongs. If a tester has completed the pressing of the 25 predefined keys according to the instruction of the present invention, he or she is able to identify the short-circuited data lines as well as the short-circuited keys of keyboard 1 from the messages displayed on the screen of the display unit.

Figure 2:
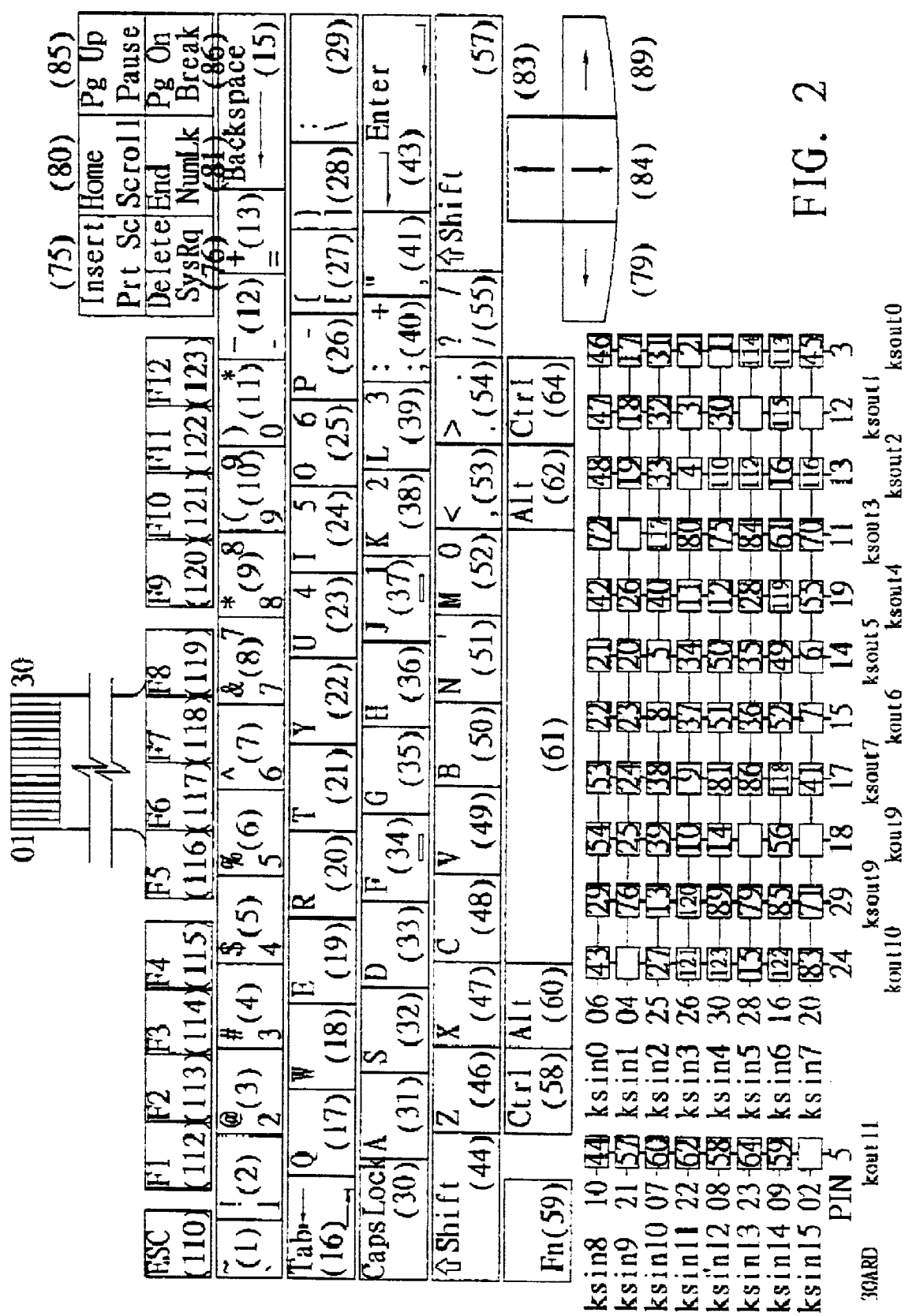
FIG. 2 is a schematic diagram of a keyboard and its corresponding keyboard matrix for illustrating the corresponding addresses of the keyboard matrix and the key number of the keys of the keyboard applicable to the method of the present invention.

FIG. 2 is the schematic diagram used to illustrate the addresses of the keyboard matrix for the corresponding keys of the computer keyboard 1. A key number is assigned to each key of the keyboard 1. The key number can also be used to show the relationship between rows and columns of data lines of the keyboard matrix. In operation of the keyboard 1, the keyboard matrix, which consists of rows and columns of data lines, is used to correspond to the keys of the keyboard 1, while the key number associated with each address of the keyboard matrix represents a corresponding key of the keyboard 1. As shown in FIG. 2, for example, the key number of address ksin2–kout10 in the keyboard matrix is 27. It corresponds to the key [[, {] of the keyboard 1. Likewise, the key number 58, which represents the address of ksin12–kout11 in the keyboard matrix, corresponds to the key [Ctrl] on the keyboard 1. The key number 35, which represents the address of ksin5–kout5 in the keyboard matrix, corresponds to the key [G] on the keyboard 1. Because the number of addresses available on the keyboard matrix is greater than that of the keys of the keyboard 1, a portion of the addresses of the keyboard matrix have no key number and no corresponding key on the keyboard 1. For example, the address of ksin1–kout13 in the keyboard matrix has no key number and no corresponding key on the keyboard 1 accordingly. When a tester presses down a key of the keyboard 1 or then releases it, the pressed or released key is always corresponding to a certain address in the keyboard matrix. The keyboard controller 2 then receives a signal variation from the address in the keyboard matrix responsive to the pressed key and thereby produces a corresponding scanned code.

Figure 3:
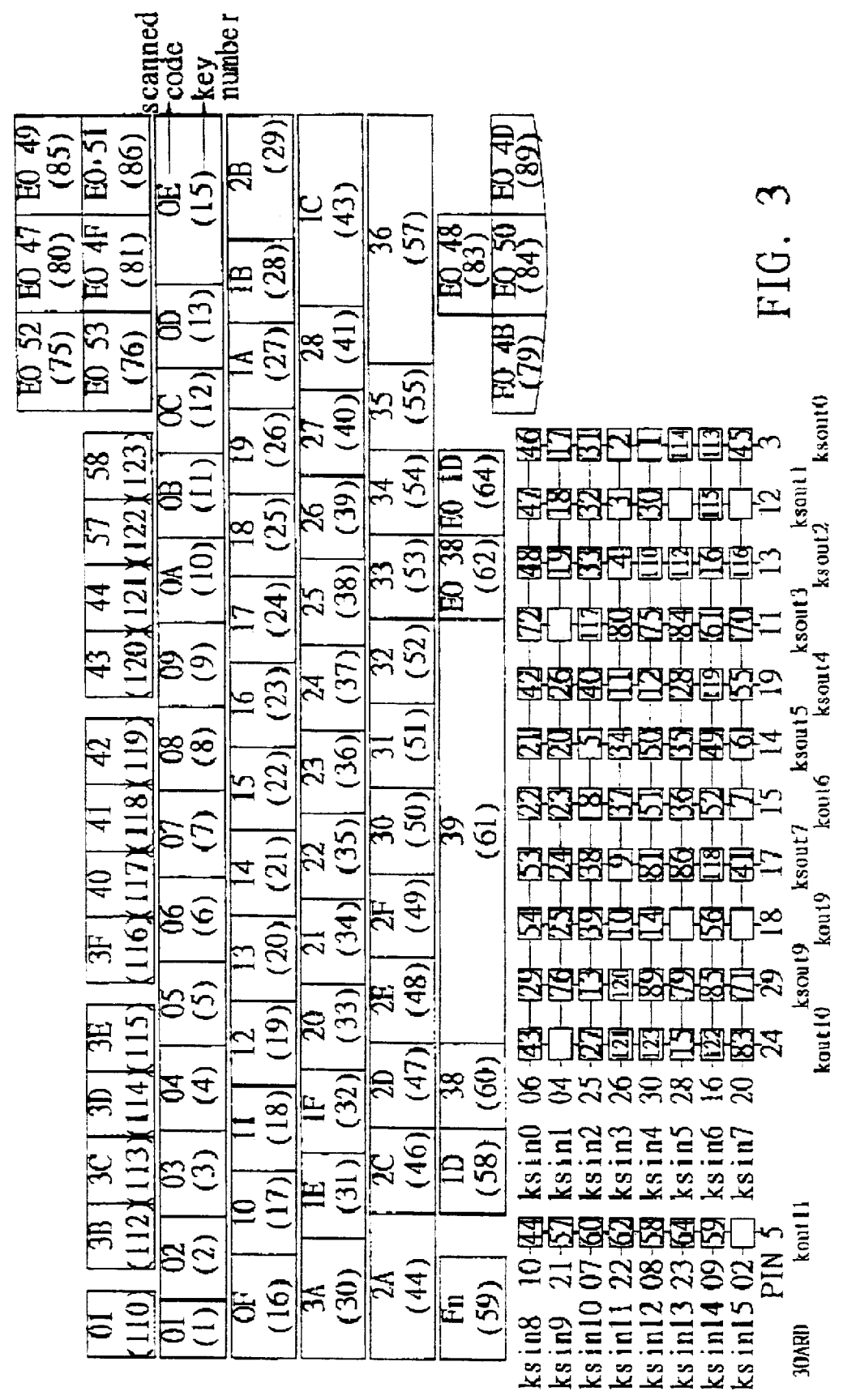

FIG. 3 is a schematic diagram of the keyboard matrix and the keyboard 1 used to illustrate the scanned code of the corresponding address in the keyboard matrix, which consists of rows and columns of data lines, when a key of the keyboard 1 is pressed. As illustrated in the drawing, for example, if key [G] whose key number is 35 is pressed, which corresponds to the address ksin5–kout5 of the keyboard matrix, the keyboard controller 2 will receive a signal variation from the address ksin5–kout5 of the keyboard matrix and then produces a corresponding scanned code 22. From the diagram of the keyboard matrix showing rows and columns of data lines, one can determine the key number associated with the corresponding address of keyboard matrix and the corresponding row and column indices of data lines. For example, the address of ksin2–kout9 corresponds to the key number 13. Similarly, the key number 32 is corresponding to the address ksin2–ksout1 and the key [S] of the keyboard 1. Accordingly, the keyboard controller 2 produces a corresponding scanned code after it receives a signal variation responsive to the pressing of a key. If a key is in the state of short-circuit (two separated columns of data lines are short-circuited, or two separated rows of data lines are short-circuited), the keyboard controller 2 still produces a scanned code for the key although it is not pressed.

Figure 4:
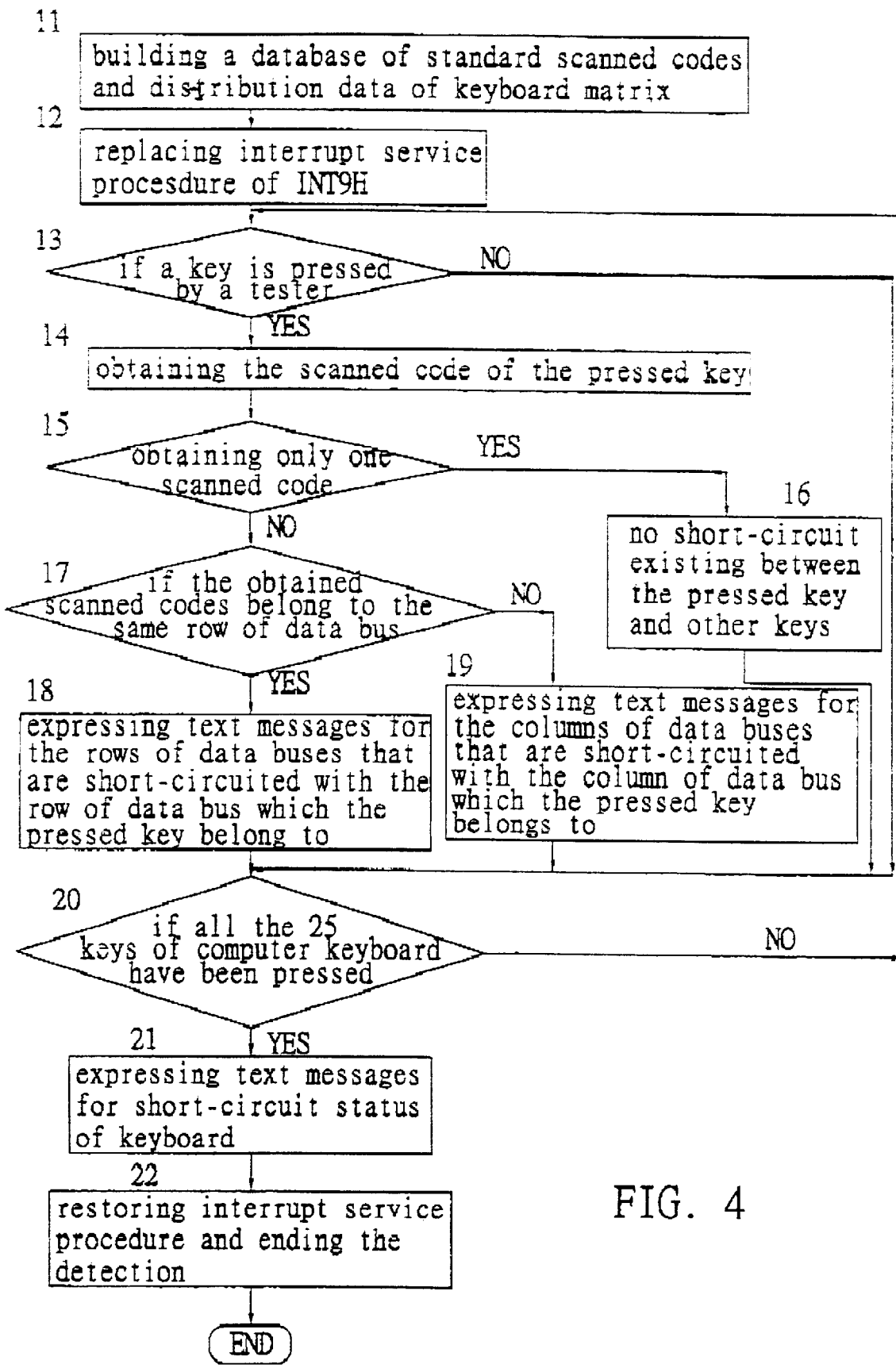
FIG. 4 is a flow chart for illustrating the operation of the system of FIG. 1.

FIG. 4 is a flow chart of the operation of the system of FIG. 1. It is used to illustrate the operating procedure for determining short-circuit of a keyboard according to method of the present invention.

First, a database of standard scanned codes and a keyboard matrix that corresponds to the keys of the keyboard 1 are built in the computer mainframe 2 in step 11 as shown in FIG. 4. The keyboard matrix consists of columns and rows of data lines, and the database of the scanned codes corresponding to the addresses of the keyboard matrix is stored in the memory device of the computer mainframe 3. Each of the keys of the keyboard 1 which is pressed induces a serial scanned code, making each key have a unique serial scanned code (expressed in the scale of 16). The built-in database of the standard codes is, during detection procedure, used to compare with the scanned code obtained from a pressed key of the keyboard 1 and to show the status of the key which is pressed. For the detection purpose, 25 keys of the keyboard 1 are predefined (to be detailed below).

In step 12, a tester obtains a scanned code after a predefined key of the keyboard 1 is pressed, by using a predefined interrupt service procedure, which is used to replace the conventional interrupt service procedure of INT9H.

Step 13 is used to check if a test presses any one of the predefined key. If no, the detection procedure moves to step 20, if yes, the detection procedure moves to step 14.

In step 14, the keyboard controller 2 receives a signal variation after a tester presses a predefined keys. Then the controller 2 produces a scanned code (expressed in the scale of 16) corresponding to the pressed key and directly sends the code to the buffer of computer mainframe 3 for conducting comparison of scanned codes.

In step 15, the computer mainframe 3 analyzes and processes the scanned code in the buffer. The computer mainframe 3 compares the scanned code obtained in step 14 with the data built-in the database of standard scanned codes established in step 11, to determine whether or not only one scanned code is obtained by pressing a key of the keyboard. If there is only one scanned code obtained, the detection procedure moves to step 16, if not, the procedure detection moves to step 17.

In step 16, the computer mainframe 3 concludes that the pressed key of the keyboard 1 corresponding to the scanned code is not short-circuited with any other keys because only one scanned code is obtained. The detection procedure then moves to step 20.

In step 17, more than one scanned code is found. In other words, short-circuits occur between columns of data lines or between rows of data lines. The computer mainframe 3 then determines whether the keys corresponding to the scanned codes are in the same columns of data line or in the same row of data line. If the scanned codes correspond to keys on the same row of data line, the detection procedure moves to step 18. Otherwise, if the scanned codes correspond to keys on the same row of data line, the detection procedure moves to step 19.

In step 18, the screen of display unit 4 shows a text message indicating the row of data line of the pressed key and the rows of data line for the keys short-circuited with the pressed key. The detection procedure then moves to step 20.

In step 19, the screen of display unit 4 shows a text message indicating the column of data line of the pressed key and the columns of data lines for the keys short-circuited with the pressed key. The detection procedure then moves to step 20.

In step 20, the computer mainframe 3 checks whether the keys of the keyboard 1 have been all pressed. If all of the keys have been pressed, the detection procedure moves to next step, 21. If not, then the detection procedure moves back to step 13.

In step 21, from the text message shown on the screen of the display unit 4 a tester can easily get detection result, i.e., the status of short-circuits between columns of data lines or rows of data lines. The detection procedure then moves to step 22.

In step 22, the status of short-circuits of the keyboard 1 and the detection procedure restores the interrupt service procedure of INT 9H. Accordingly, the fast procedure of detecting keyboard matrix comes to an end.

FIG. 5 is a diagram showing the text messages shown on the screen of the display unit 4. The message indicates the condition of short-circuits between data lines when a key is pressed by using the method of the present invention. As shown in the drawing, a tester follows a pre-prepared instruction to press 25 predefined keys one by one as follows. If the key [Z] whose key number is 46 is pressed and the keyboard controller 2 receives a signal variation only corresponding to the key [Z], the computer mainframe 3 only obtains one scanned code for key [Z]. Under this circumstance, key [Z] is not short-circuited with any other keys. However, if the keyboard controller 2 receives not only a signal variation corresponding to key [Z] but also a signal variation corresponding to key [Q] whose key number is 17, the computer mainframe 3 obtains the scanned code of key [Z] and key [Q] simultaneously. Therefore, by comparing the scanned codes obtained from the keyboard controller 2 with the built-in database of scanned codes, the computer mainframe 3 can determine that the short-circuit occurs between the row of data line ksin0 and the row of data line ksin0. The screen of the display unit 4 will then show messages indicating the situation. On the other hand, if the computer mainframe 3 obtains the scanned codes of key [Z] and key [X] whose key number is 47 simultaneously, it is able to determine derives that the short-circuit occurs between the column of data line ksout0 and the column of data line ksin0. The screen of the display unit 4 will then show messages indicating the situation of the second case as shown in FIG. 6.

Below, the keyboard matrix corresponding to the keyboard 1 will be used to demonstrate how the method of the present invention is applied to identify short-circuits between data lines.

In the case of short-circuits occurred between rows of data lines, if ksin8 of the row of data line is short-circuited with ksin9 of the row of data line. The pressing of the key with key number 44 will make the key with key number 57 to be in the situation of being pressed. Since both keys are on the same column of data line, ksout11, the connection of ksin8 of the row of data line and kout11 of the column of data line brings ksin9 of the row of data line to also connect kout11 of the column of data line. Consequently, this is equivalent to pressing the key with key number 57. Similarly, suppose the row of data line, ksin0, is short-circuited with the row of data line, ksin1, the pressing of the key with key number 29 will make the key with key number 76 to be in the situation of being pressed. Since both keys, 29 and 76, are on the same row of data line, ksout9, the connection of ksin0 of the row of data line and kout1 of the column of data line brings the row of data line, ksin1, to connect the column of data line, kout9. Consequently, this is equivalent to the pressing of the key with key number 60.

For the short-circuits between the columns of data lines from ksout0 through ksout10, the method of short-circuit detection is essentially similar to that for the rows of data lines from ksin0 through ksin7. Therefore the description thereto will be not further detailed here.

For the columns of data lines ksout10 and ksout11, the pressing of any key on the column of data line of ksout11 has no effect on the keys with the columns of data line of ksout10 because ksout10 and ksout11 do not share the same rows of data lines. Therefore, whether ksout10 and ksout11 are short-circuited or not does not de facto affect functionality of the keyboard 1. Likewise, a tester need not check short-circuits between the column of data lines ksout11 and any column of data lines from ksout0 through ksout10.

The rows of data lines from ksin8 through ksin15 and those from ksin0 and ksin7 do not share the same column of data lines so the short-circuit, if any, between the two columns of data lines does not affect the functionality of the keyboard 1 at all. Therefore it is not necessary to check the short-circuit between the two columns of data lines.

Based on the above, to check the status of short-circuits between any two rows of data lines from ksin8 through ksin15, one only needs to press 7 keys one after one in the order: the key [left shift] with key number 44, the key [right shift] with key number 57, the key [left Alt] with key number 60, the key [right Alt] with key number 62, the key [left Ctrl] with key number 58, the key [right Ctrl] with key number 64, and the key [Fn] with key number 59. The status of short-circuits between the rows of data lines from ksin8 and ksin15 then can be determined by examining the scanned codes for the 7 defined keys one after one.

To check the status of short-circuits between any two rows of data lines from ksin0 through ksin7, one only needs to press 8 keys one after one in the order: the key [<] with key number 53, the key [I] with key number 24, the key [K] with key number 38, the key [8] with key number 9, the key [End] with key number 81, the key [PgDn] with key number 86, the key [F7] with key number 118, and the key ['] with key number 41. The status of short-circuits between the rows of data lines from ksin0 and ksin7 then can be determined by examining the scanned codes for the 8 defined keys one after one.

To check whether or not the columns of data lines from ksout0 through ksout10 are short-circuited, one only needs to press 11 keys one after one in the order, the key [[] with key number 27, the key [=] with key number 13, the key [L] with key number 39, the key [K] with key number 38, the key [7] with key number 8, the key [4] with key number 5, the key [;] with key number 40, the key [F6] with key number 117, the key [D] with key number 33, the key [S] with key number 32, and the key [A] with key number 31. The status of short-circuits between the columns of data lines from ksout0 and ksout10 then can be determined by examining the scanned codes for the 11 defined keys one after one.

The key [K] with the number 38 is counted twice, so only 25 keys in total are necessary for determining short-circuits between the rows of data lines from ksin8 through ksin15, those between the rows of data lines from ksin0 through ksin7, and those between the columns of data lines from ksout0 through ksout10 in order to complete the detection of short-circuits for the keyboard 1.

Following the instructions pre-prepared for the method of the present invention, a tester only needs to press 25 predefined keys one after one for detecting a computer keyboard. From text messages on the screen of the display unit, he or she can determine whether any key of the keyboard is short-circuited.

Method of detecting short-circuits of a keyboard according to the present invention has the following merits:
1. A tester needs to press only 25 keys, instead of every key on the keyboard, to obtain the detection results about the short-circuits of the keyboard;
2. Test messages will show on the screen of the display unit when keys are short-circuited.

Although certain preferred embodiments of the present invention have been shown and described in detail, it should be understood that various changes and modifications may be made therein without departing from the scope of the appended claims.

What is claimed is:

1. A method of detecting short-circuits of a keyboard, which is applicable to a computer system consisting of a keyboard, a keyboard controller, a computer mainframe with a buffer, a central processor unit and a memory device, and a display unit, the method comprising the following steps:
   (1) establishing a database of standard scanned codes and a keyboard matrix corresponding to keys of the keyboard in the computer mainframe; each key being assigned with a scanned code and a key number and the keyboard matrix being composed of rows of data lines and columns of data lines;
   (2) pre-defining a set of 25 keys for detection purpose;
   (3) using a predefined interrupt service procedure to obtain the scanned codes of computer keyboard;
   (4) pressing one of the predefined keys of the keyboard for the keyboard controller to receive a signal variation and to then produce a scanned code responding to the pressed key, followed by transmitting the scanned code into the buffer of the computer mainframe for the process of conducting comparison of the scanned codes;
   (5) having the computer mainframe to analyze and process the data in the buffer for comparing the scanned code obtained from step (4) with data in the database of standard scanned codes in the computer mainframe;
   (6) showing messages on a screen of the display unit for identifying the pressed key that is short-circuited and indicating data of the columns and rows of the data lines corresponding to the pressed key and the keys short-circuited with the pressed key;
   (7) performing the steps (4)–(6) until the 25 predefined keys have been respectively pressed and then moving to step (8); and
   (8) showing the complete short-circuit status of the keyboard on the screen of the display unit.

2. The method of claim 1, wherein the step (4) the key which is pressed is short-circuited with another key of the keyboard if more than one scanned code is obtained by the computer mainframe.

3. The method of claim 1, further comprising the following steps subsequent to the step (4):
   (4-1) determining whether or not only one scanned code is obtained; if yes, moving to step (4-2) and if not, moving to step (4-3);
   (4-2) having the computer mainframe identify the pressed key corresponding to the scanned code on the keyboard and conclude that the pressed key is not short-circuited with other keys; then moving to step (7);
   4-3) having the computer mainframe determine whether the keys corresponding to the scanned codes belong to the same row of data line or the same column of data line; moving to step (4-4) if the keys corresponding to the scanned codes belong to the same row of data line, otherwise, moving to step (4-5) if the keys corresponding to the scanned codes belong to the same column of data line;
   (4-4) showing a message on the screen of the display unit for identifying the pressed key that is short-circuited and indicating the column of data line to which the pressed key belongs and other columns of data lines to which the keys short-circuited with the pressed key belong; then moving to step (7); and (4-5) showing a message on the screen of the display unit for identifying the pressed key that is short-circuited and indicating the row of data line to which the pressed key belongs and other rows of data lines to which the keys short-circuited with the pressed key belong; then moving to step (7).

* * * * *